US009891126B2

(12) United States Patent
Drewes et al.

(10) Patent No.: US 9,891,126 B2
(45) Date of Patent: Feb. 13, 2018

(54) METHOD FOR SOLDERING A CONNECTING ELEMENT

(71) Applicant: Endress + Hauser GmbH + Co. KG, Maulburg (DE)

(72) Inventors: Ulfert Drewes, Mullheim (DE); Elke Schmidt, Bad Sackingham (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 88 days.

(21) Appl. No.: 14/766,767

(22) PCT Filed: Jan. 24, 2014

(86) PCT No.: PCT/EP2014/051413
§ 371 (c)(1),
(2) Date: Aug. 10, 2015

(87) PCT Pub. No.: WO2014/122033
PCT Pub. Date: Aug. 14, 2014

(65) Prior Publication Data
US 2015/0377731 A1    Dec. 31, 2015

(30) Foreign Application Priority Data

Feb. 11, 2013    (DE) .................... 10 2013 101 315

(51) Int. Cl.
*G01L 9/00*    (2006.01)
*H05K 1/11*    (2006.01)
(Continued)

(52) U.S. Cl.
CPC ........ *G01L 9/0075* (2013.01); *G01L 19/0061* (2013.01); *H05K 1/111* (2013.01);
(Continued)

(58) Field of Classification Search
CPC ...... H05K 3/3421; H05K 1/111; H05K 1/113; H05K 1/0218; H05K 1/0306; H05K 3/341;
(Continued)

(56) References Cited

U.S. PATENT DOCUMENTS 5,759,047 A  *  6/1998  Brodsky ........... H01L 23/49811
                                              439/66
5,925,826 A      7/1999  Kodama et al.
(Continued)

FOREIGN PATENT DOCUMENTS

CN    102460101 A    5/2012
DE    19752977 A1    2/1999
(Continued)

OTHER PUBLICATIONS

English Translation of International Preliminary Report on Patentability, WIPO, Geneva, dated Aug. 20, 2015.
(Continued)

*Primary Examiner* — David Bolduc
(74) *Attorney, Agent, or Firm* — Bacon & Thomas, PLLC (57) ABSTRACT

Method for soldering a connection element to a connection point on an electrically conductive coating that is suitable for soft-soldering on an insulating surface of a base body using a soft-soldering method; as well as sensors manufactured using this method for which a spatial limitation of the wetting of the coating with soft-solder material, during the process of soft-soldering, is effected by providing a groove in the base body which at least partly surrounds the connection point on the outside. At least a part of the area of the external insulating surface of the base body including the connection point is coated with the coating, and soft-solder material is locally applied to the connection point and the connection element is soldered onto the connection point
(Continued)

using the applied soft-solder material in a soft-soldering process.

8 Claims, 4 Drawing Sheets

(51) Int. Cl.
*H05K 3/34* (2006.01)
*G01L 19/00* (2006.01)
*H05K 1/02* (2006.01)
*H05K 1/03* (2006.01)

(52) U.S. Cl.
CPC ........... *H05K 3/341* (2013.01); *H05K 3/3421* (2013.01); *H05K 1/0218* (2013.01); *H05K 1/0306* (2013.01); *H05K 1/113* (2013.01); *H05K 2201/09036* (2013.01); *H05K 2201/10151* (2013.01); *H05K 2201/2036* (2013.01); *Y02P 70/611* (2015.11); *Y02P 70/613* (2015.11)

(58) Field of Classification Search
CPC .......... H05K 2201/09036; H05K 2201/10151; H05K 2201/2036; G01L 9/0075; G01L 19/0061; Y02P 70/611; Y02P 70/613
See application file for complete search history.

(56) References Cited

U.S. PATENT DOCUMENTS

| | | | |
|---|---|---|---|
| 6,615,665 B1 | 9/2003 | Flogel et al. | |
| 7,140,256 B2 | 11/2006 | Flogel et al. | |
| 7,265,045 B2 * | 9/2007 | Lee | H01L 23/3114 257/E21.508 |
| 8,053,685 B2 | 11/2011 | Watanabe et al. | |
| 2003/0121698 A1* | 7/2003 | Kyougoku | H01L 23/13 174/261 |
| 2009/0170312 A1* | 7/2009 | Caplet | B81B 3/001 438/660 |
| 2010/0059879 A1* | 3/2010 | Bielen | H01L 23/147 257/712 |
| 2010/0244246 A1* | 9/2010 | Caplet | B81B 7/007 257/738 |
| 2012/0324998 A1* | 12/2012 | Fujiwara | G01L 9/0008 73/431 |
| 2013/0168840 A1* | 7/2013 | Merassi | H01L 23/562 257/674 |

FOREIGN PATENT DOCUMENTS

| | | |
|---|---|---|
| DE | 10360127 A1 | 7/2005 |
| DE | 102010003145 A1 | 9/2011 |
| EP | 1106982 A1 | 6/2001 |
| JP | 2004140226 A | 5/2004 |
| JP | 2010197057 A | 9/2010 |
| WO | 03058186 A2 | 7/2003 |
| WO | 2011117014 A3 | 9/2011 |

OTHER PUBLICATIONS

International Search Report,, EPO, The Netherlands, dated Apr. 30, 2014.
German Search Report, German PTO, Munich, dated Mar. 27, 2013.

* cited by examiner

METHOD FOR SOLDERING A CONNECTING ELEMENT

TECHNICAL FIELD

The invention concerns a method for soldering a connecting element at a connection point on an electrically conductive, suitable for soft-soldering coating that is applied to an insulating external surface of a base body using a soft-soldering method, as well as sensors manufactured using this method.

BACKGROUND DISCUSSION

Such methods may especially be used in the manufacture of sensors, e.g. capacitive ceramic pressure sensors, in order to obtain electrically conductive connections between a conductive sensor shield or a connection between the sensor and measurement electronics or a reference potential.

One example of a capacitive ceramic pressure sensor is described in German Patent, DE 10 2008 054 879 A1. It comprises a ceramic base body, a pressure-sensitive measuring membrane connected to the base body forming a measuring chamber, and an electro-mechanical transducer. The electro-mechanical transducer transforms a pressure-related deformation of the measuring membrane into a primary electrical signal, which is available via ports that are led through the base body to an outer surface of the base body. Said ports are connected by connecting elements to an on-site electronic system which is separated from the base body. The electronic system generates a measuring signal from the primary signal and makes it accessible for further processing, evaluation and/or display.

European Patent, EP 1 106 982 A1 describes another example of a ceramic pressure sensor having a base body provided with a conductive coating to shield it against electromagnetic noise signals.

Today, ceramic base bodies are preferably coated by sputtering the base body with metals made available in a target, e.g. gold or silver. Alternatively, metallic varnishes such as conductive carbon or silver lacquers are used.

Such coatings have the disadvantage that they regularly have very good wetting properties as regards soft solders. This creates a risk of the soft solder material applied to it running uncontrollably across the surface of the coating during soldering, and even wetting parts of the surface of the coating outside the connection point.

If a larger area is wetted, there will be less solder material available per unit area. In order to obtain a qualitatively unobjectionable solder joint, it is necessary to use amounts of soft solder material large enough to ensure that there will always be a sufficient amount of solder material per unit area at the connection point, despite the flow process initiated during the soldering process.

After soldering, the solder material solidifies throughout the wetting area. This means that uneven areas may occur on the coating surface even outside the connecting point. In many cases areas affected by this cannot therefore be used, or if so only to a limited extent. Due to the unevenness, these areas cannot be used, for example, to support a sensor bracket, fixing or mount. The latter are, for instance, required for installing the sensor in a housing, for mounting it at its location of use or for installing it in a process interface. Furthermore, other elements, such as a drilled hole in the base body provided for inputting a reference pressure, must be placed at a suitable minimum distance from the connection point. Both aspects are disadvantageous, particularly with regard to the miniaturization of sensors which is desired for many applications.

In order to limit the surface wetted during soft-soldering, it would be possible to apply an additional coating of non-wettable material to the surface area of the coating surrounding the connection point. However, this would require an additional process step.

In cases where this is possible due to the other requirements made of the coating, the coating might be interrupted in the area surrounding the connection point in question. This could, for example, be done by applying an appropriate mask during the coating process.

SUMMARY OF THE INVENTION

One of the tasks of the invention is to describe a method for soldering a connection element to a connection point on the electrically conductive coating suitable for soft-soldering applied to an outer insulating surface of a base body using a soft-soldering method, which can bring about a spatial limitation of the wetting of the coating with soft-solder material during the soft-soldering process.

For this purpose, the invention comprises a method for soldering a connection element to a connection point on an electrically conductive coating suitable for soft-soldering applied to an external insulating surface of a base body, which includes
- providing a groove in the base body that at least partly surrounds the connection point on the outside,
- applying the coating to at least a part of the area around the connection point on the exterior insulating surface of the base body,
- the application of soft-solder material locally to the connection point, and
- the soldering of the connection elements with the soft-solder material applied at the connection point using a soft-soldering method.

In a preferred embodiment of the method, the groove surrounds the connection point entirely, esp. as a ring.

In another embodiment, the groove has a distinct bend or curve, which enables visual recognition of the connection point location.

In a further development of the method, the connection point is connected via the corresponding coating to the connection area of a port distanced from it on the outer insulating surface of the base body, this being effected by applying the coating in such a way that it surrounds the connection area and is conductively connected to the connection point.

Furthermore, the invention includes a sensor, comprising:
- a base body,
- an electrical connection,
- is routed into a connection area on the outer insulating surface of the base body,
- an electrically conductive coating suitable for soft-soldering applied to the outer insulating surface of the base body
- which surrounds the connection area of the connection and
- which includes a connection point intended for contacting this connection,
- a groove provided in the base body that at least partly surrounds the connection point on the outside, and
- a connection element soldered onto the coating at the connection point by means of a soft-soldering method.

In a first further development of the sensor the connection is a connection to a sensor shield against electromagnetic interference, the coating is part of the shield, and the coating forms the connection area of this connection.

In another further development of the sensor, according to the invention, at least one additional electrical connection is included, which is routed into a connection area on the outer insulating surface of the base body, whose connection area is coated with an electrically conductive coating suitable for soft-soldering applied to the exterior insulating surface of the base body, which includes a connection point intended for the contacting of this connection, whose connection point is at least partly surrounded on the outside by the groove provided in the base body, and with a connection element soldered to its connection point via a soft-solder joint on the coating, and in which the individual coatings applied to the base body are electrically insulated from each other.

One embodiment of the sensor according to the invention includes a sensor in which at least one connection point is located in the connection area of the corresponding connection and/or at least one connection point is outside the connection area of the corresponding connection, and electrically connected to the connection area of the respective connection via the respective coating surrounding this connection point and encircling the respective connection area.

In a preferred embodiment of the sensor, at least one groove surrounds the respective connection point entirely, esp. in the shape of a ring.

In another preferred embodiment of the sensors, at least one groove shows a distinct bend or curve which enables recognition of the connection point location.

Another embodiment includes a sensor in which the sensor is a capacitive pressure sensor with a measuring membrane connected to the base body thereby forming a measuring chamber, and one of the connections is a connection to a measuring electrode affixed to the base body, and/or one of the connections is a connection to a reference electrode affixed to the base body, and/or one of the connections is a connection routed through the base body to a counter-electrode affixed to the measuring membrane.

Furthermore, the invention includes a sensor designed in accordance with the first further development and the embodiment last mentioned, in which the coating of the connection area to which the connection linked to the counter-electrode is routed, at the same time serves as the coating for the shield, and the connection point intended for the contacting of the connection to the counter-electrode is the same as the connection point intended for the contacting of the shield.

In one embodiment of the sensor according to the invention, the coating is applied at least to those groove areas of the grooves which are found in areas used to electrically link one of the connection areas with a distanced respective connection point via the respective coating.

In a preferred embodiment of the sensor according to the invention, the base body consists of a ceramic material, esp. an aluminum oxide ceramic, and/or the coatings are of gold, silver, a copper alloy or metal layers, especially nickel or nickel alloys, which are covered with a top layer suitable for soft-soldering, or a conductive metallic varnish, esp. a conductive carbon or silver lacquer, and/or the soft-soldering connections are made of a tin-silver solder material, a tin-copper solder material or soldering material containing indium or bismuth, esp. a tin-silver solder material containing indium and/or bismuth.

BRIEF DESCRIPTION OF THE DRAWINGS

The invention and its advantages will now be explained in detail using the figures in the drawing which show three examples of embodiments. The same elements are indicated by the same reference numbers in the figures.

DETAILED DISCUSSION IN CONJUNCTION WITH THE DRAWINGS

Figure 1:
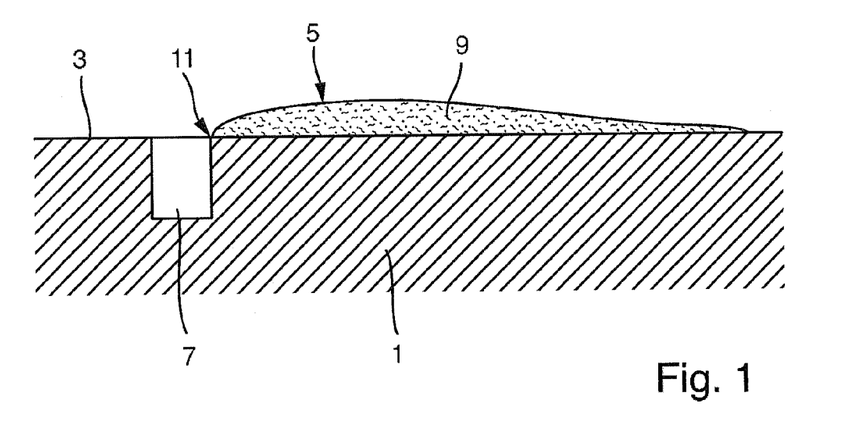
FIG. 1 shows: the wetting with soft-solder material of a ceramic base body with a conductive coating.

For the purpose of illustrating the invention, FIG. 1 shows a section of a base body 1, with an electrically conductive coating 3 suitable for soft-soldering applied to its exterior insulating surface. The base body 1, for example, consists entirely of an insulating material, e.g. a ceramic material, esp. aluminum oxide, or an insulating plastic. Alternatively, it may also consist of a conductive material which is provided with an insulating layer on the outside, e.g. of a metal coated with an insulating layer.

On the coating 3 of the base body 1, a spatially limited connection point 5 is provided, to which a connection element—not shown here—is to be connected to the coating 3 by means of an electrically conductive soft-solder joint.

According to the invention, a groove 7 is provided in the base body 1 that at least partly surrounds the connection point 5 on the outside. The groove 7 is formed as a recess in the base body 1 open towards the external side of the base body that is to be subsequently coated. In the most simple case shown here, it has the form of a straight line running along the side of the connection point 5. Alternatively, the groove 7 may also take the form of a curved line partly encompassing the connection point 5 on the outside. Said curved line may have the form of a circle or ellipse, or show a distinct bend in its course. Preferably, a groove 7 is used which encompasses the connection point 5 on all sides, esp. in the form of a ring.

For ceramic base bodies 1, the groove 7 is preferably created directly during production. For this purpose, the base body 1 is, for example, made of granules that are poured into a prefabricated mold, compressed there and then sintered. It is possible to produce the desired geometry of the base body including the groove 7 with very low manufacturing tolerances if the mold is defined accordingly, without any additional step in the manufacturing process.

Alternatively, the groove 7 may of course be created in an existing base body 1 by, for example, cutting, grinding or milling. For base bodies made of conductive material, the surface of the groove is also coated with the insulating layer.

Following this, at least a part of the area of the insulating exterior surface of the base body 1 comprising the connection point 5 is covered with the coating 3. For this purpose, the coating 3 is preferably sputtered onto the base body 1 as a metalization. The metalization preferably consists of gold, silver, or a copper alloy or other metal layers, especially nickel or nickel alloys provided with a top coating suitable for soft-soldering.

Alternatively, the coating 3 may also be applied as a metallic varnish, e.g. as a conductive carbon or silver lacquer.

In a following step, soft-solder material 9 is locally applied to the connection point 5 and the connection element that is not shown in FIG. 1 is soldered to the connection point 5 in a soft-soldering process using the soft-solder material 9 applied.

The soft-soldering material 9 used may, for example, be a tin-silver solder material, a tin-copper solder material or soldering material containing indium or bismuth, esp. a tin-silver solder material containing indium and/or bismuth. Alternatively, soldering material containing lead may be used.

The soft-soldering process may, for example, be carried out manually or using a soldering robot by applying the soft-soldering material 9 via a soldering wire which is melted at the connection point 5 and the connection element being inserted into the melted soft-soldering material 9. In the case of manual soldering, the groove 7 has the advantage that it may also be used as a positioning aid for positioning the soldering point at the connection point 5. In this respect, esp. a shape with a distinct bend, curve or ring surrounding the connection point 5 offers the advantage that it visually indicates the position of the connection point 5 on the base body 1.

However, the preferred method is a mass soldering process such as reflow soldering, with the soft-soldering material 9 preferably being applied beforehand as a soldering paste to one or more base bodies 1, e.g. using a dispenser on one or more connection points 5 to be soldered in parallel, the appropriate number of connection elements being applied to the respective connection points 5—if possible using a positioning machine—and then the connection elements being soldered by a reflow soldering process.

FIG. 1 shows the wetting behavior of the soft-solder material 9 during melting. During the melting process the soft-solder material 9 runs over the surface of the coating 3 and wets it. Where the soft-solder material 9 reaches the groove 7, the wetting angle changes drastically at the transition 11 to the groove 7. This stops further spreading of the soft-solder material 9. This effect also occurs if the groove 7 is also covered with the coating 3. In the embodiment shown, the wetting angle changes by 90°. However, even smaller changes in the wetting angle are sufficient to stop any further spreading of the soft-solder material 9.

The groove 7 causes a spatial limitation of the wetting of the coating 3 with soft-solder material 9 which occurs during the soft-soldering process. If the groove 7 has the form of a closed line encompassing the connection point 5 on all sides, the total wettable area will thus be limited. This offers the advantage that the amount of solder material required is reduced by the groove 7. Furthermore, it can be precisely defined beforehand and accordingly be applied in an exact amount.

However, even a groove 7 that only partly encompasses the connection point 5 on the outside will already result in a reduction of the solder material needed.

In addition, the groove 7 ensures that there is no wetting of the areas in the coating 3 which are on the opposite side of the groove 7 to the connection point 5. Such areas are thus available for other uses.

The method according to the invention may esp. be used in manufacturing sensors which have a base body and at least one connection routed into a connection area in the external insulating surface of the base body. In this context, it may be used for contacting individual or all connections. For this, an electrically conductive coating suitable for soft-soldering is applied to the base body for each connection to be contacted according to the invention, as well as the corresponding connection point. The contacting of the connections is then effected via connection elements which are soldered onto the corresponding connection points as described above using a soft-soldering method.

Here as well, the base body consists of, for example, a ceramic material of aluminum oxide, and the coatings consist of, for example, sputtered gold, silver, copper alloys or other metal layers, especially nickel or nickel alloys that are covered with a top layer suitable for soft-soldering, or an applied conductive metallic varnish, e.g. a conductive carbon or silver lacquer.

Given the appropriate insulation of the individual connections of a sensor with respect to each other and with respect to the base body, here too a base body made of conductive material may be used provided its surface is covered with an insulating layer.

Figure 2:
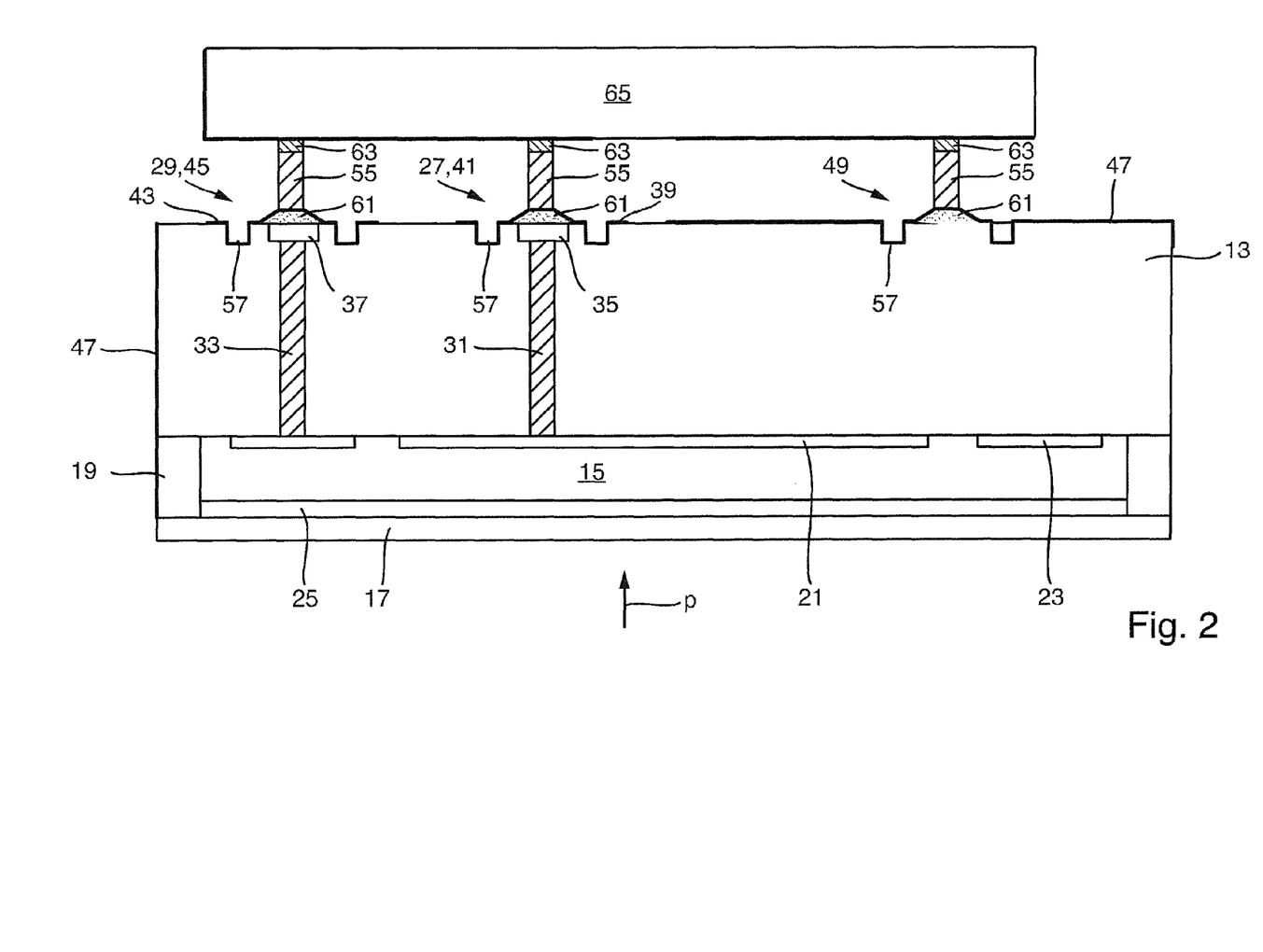
FIG. 2 shows: a capacitive pressure sensor manufactured using the method according to the invention.

FIG. 2 shows a capacitive ceramic pressure sensor as an example of one embodiment. The sensor comprises a cylindrical ceramic base body 13 and a disc-shaped measuring membrane 17 that is in pressure-tight connection with the base body 13, forming a measuring chamber 15. The latter consists, e.g., of the same ceramic material as the base body 13, esp. of aluminum oxide. The base body 13 and the measuring membrane 17 are connected together at a distance from each other by a ring-shaped metallic infix 19.

Depending on the purpose of the pressure sensor, a counter-pressure prevails in the measuring chamber 15 which differs from the pressure p applied to the exterior side of the measuring membrane 17. For a relative pressure sensor, the counter-pressure is the atmospheric pressure around the sensor which is input into the measuring chamber 15 via a reference pressure line not shown here. In the case of an absolute pressure sensor, the measuring chamber 15 is evacuated. The measuring membrane 17 is pressure-sensitive, i.e. any pressure p applied to it causes the measuring membrane 17 to deflect from its rest position. The pressure sensor comprises an electromechanical transducer which is used to transform a pressure-related deformation of the measuring membrane 17 into a primary electrical signal. Capacitive or resistive transducers, for example, are suitable for this. In the embodiment of a capacitive pressure sensor shown here, the transducer includes a disc-shaped measuring electrode 21 affixed to the side of the base body 13 facing the measuring membrane 17, a disc-shaped reference electrode 23 concentrically encompassing the measuring electrode 21, and a counter-electrode 25 arranged on the inside of the measuring membrane 17. The measuring electrode 21 and the counter-electrode 25 form a capacitor whose capacity varies according to the pressure-related deflection of the measuring membrane 17. The reference electrode 23 and the counter-electrode 25 form a reference capacitor. The capacity of the reference capacitor is constant due to the position of the reference electrode 23 on the outer edge of the sensor element where the measuring membrane 17 is practically unaffected by any pressure-related deflection.

The electro-mechanical transducer here comprises two connections 31, 33, separately routed into the respective connection areas 27, 29 which are electrically insulated from each other and located on the exterior surface of the base body 13. The first connection 31 comprises a metal contact pin passing through the base body 13 which connects the measuring electrode 21 to a contact area 35 located in the corresponding connection area 27 and terminating flush with the surface of the base body 13. The second connection 33 comprises a metal contact pin passing through the base body 13 which connects the reference electrode 23 to a contact area 37 found in the corresponding connection area 29 and terminating flush with the surface of the base body 13.

In the example of embodiment shown, a first electrically conductive coating 39 suitable for soft-soldering is applied to the exterior insulating surface of the base body 13, enclosing the connection area 27 of the first connection 31 and comprising a connection point 41 intended for the contacting of this connection 31 on the base body 13. In addition, a second electrically conductive coating 43 suitable for soft-soldering is applied to the exterior insulating surface of the base body 13, enclosing the connection area 29 of the second connection 33 and comprising a connection point 45 intended for the contacting of this connection 33 on the base body 13.

In the example of embodiment shown in FIG. 2, the connection points 41, 45 are directly located within the respective connection areas 27, 29.

Figure 3:
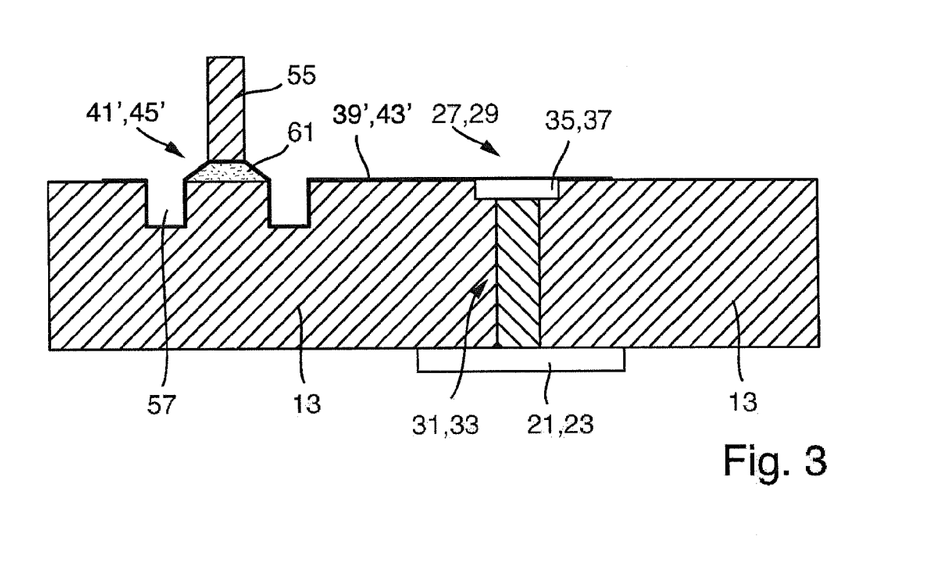
FIG. 3 shows: a connection of a sensor that is contacted at a connection point outside its connection area.

An appropriate shape of the coating can, however, also serve to provide connection points which are outside the connection areas 27, 29 of the respective connections 31, 33. One example of this is shown in FIG. 3. For this purpose, the respective coating 39', 43' encloses the respective connection area 27, 29 of the connection 31, 33 and comprises the physically separate respective connection point 41', 45' intended for the contacting of the respective connection 31, 33. Accordingly, the connection area 27, 29 of each connection 31, 33 with the corresponding connection point 41', 45' is connected via the electrically conductive coating 39', 43'. This variation of the invention has the advantage that the connection points 41', 45' may be positioned independently of the connection areas 27, 29 usually determined by the type of sensor. This means that spatial circumstances or the position of contacts of the electronic system that is to be connected with the respective connection port can be taken into account when the sensor is installed.

In order to avoid a short circuit between the two connections 31, 33, the individual coatings 39 and/or 39' as well as 43 and/or 43' must be electrically separated. In the present case, this is accomplished by placing them physically separate, thus ensuring that the insulating surface of the base body 13 lies between them and insulates them against each another.

The sensor shown in FIG. 2 has a shield against electro-magnetic interference, as, for example, described in EP 1 106 982 A1. The shield preferably includes an extensive, electrically conductive coating 47 suitable for soft-soldering applied to the external insulating surface of the base body 13. In the present case, the coating 47 covers the free areas of the front side of the base body 13 not facing the membrane, its exterior sleeve area and the exterior sleeve area of the infix 19. It is connected to the counter-electrode 25 directly contacting the infix 19 via the infix 19.

In this case, it is naturally also necessary to electrically insulate the coating 47 of the shield with respect to all other electrical connections 31, 33, the corresponding connection areas 27, 29, the corresponding connection points 41 or 41', 45 or 45' and the coatings 39 or 39', 43 or 43' in order to avoid short circuits. This is done here as well by physically distancing the coating 47 of the shield from those elements and thus electrically insulating it against them by means of the insulating surface of the base body 13 between them.

The shield also has a connection that is routed to a connection area positioned on the exterior surface of the base body 13. This connection and its connection area is in the present case directly created via the coating 47 itself, with the connection area extending over the entire area of the coating 47 on the exterior surface of the base body 13. Accordingly, the connection point 49 where the shield is eventually contacted may be located anywhere along the coating 47.

Figure 4:
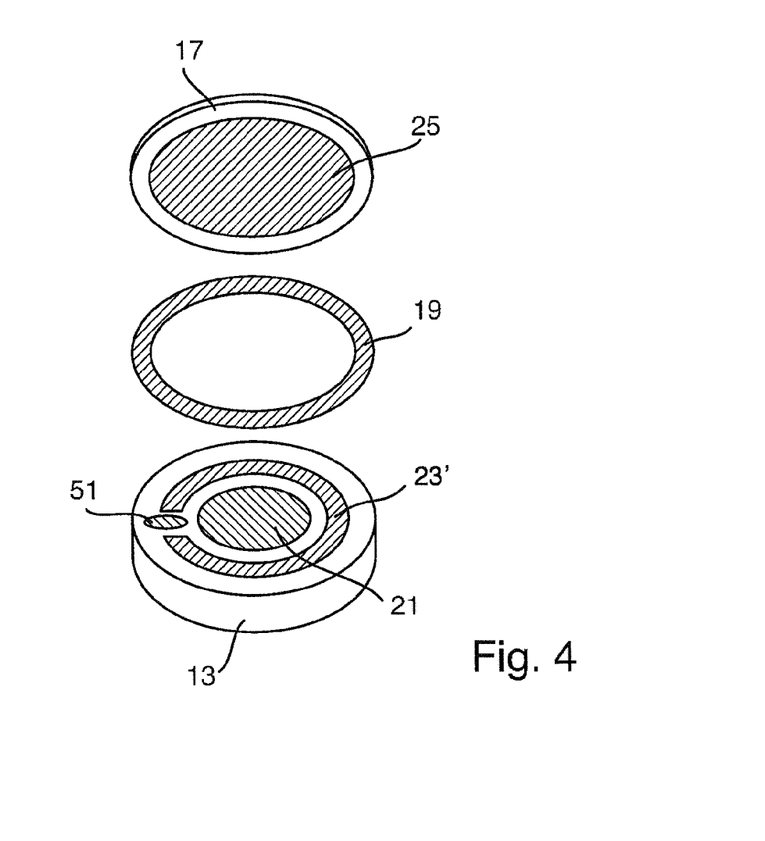
FIG. 4 shows: an exploded view of a pressure sensor.

Alternatively or in addition, another connection may be provided, which is connected to the counter-electrode 25 and routed through the base body 13 and into a connection area 53 coated with the coating 47 and located on the external surface of the base body 13. FIG. 4 shows an example of embodiment as an exploded view of a corresponding pressure sensor. Due to the high degree of conformity with the pressure sensor shown in FIG. 2, the following paragraphs concern only the existing differences. Otherwise, reference is made to FIG. 2 for the embodiments.

The pressure sensor in FIG. 4 differs from the pressure sensor shown in FIG. 2 in that the reference electrode 23' affixed to the base body 13 has the shape of a ring segment which is almost fully closed. Another electrode 51 is arranged between the two ends of this ring segment. The electrode 51 preferably has an elongated shape whose outer end is in contact with the metal infix 19 in the assembled sensor, and whose inner end runs to the middle of the sensor in the direction of the measuring membrane 21. Just as with the connections 31, 33 for the measuring electrode 21 and the reference electrode 23, the connection to the counter-electrode 25 also has a metal contact pin running through the base body 13—not visible in the exploded view—which is used to connect the additional electrode 51 connected to the counter-electrode 25 via the infix 19 to the respective connection area 53 on the opposite external surface of the base body 13.

Figure 5:
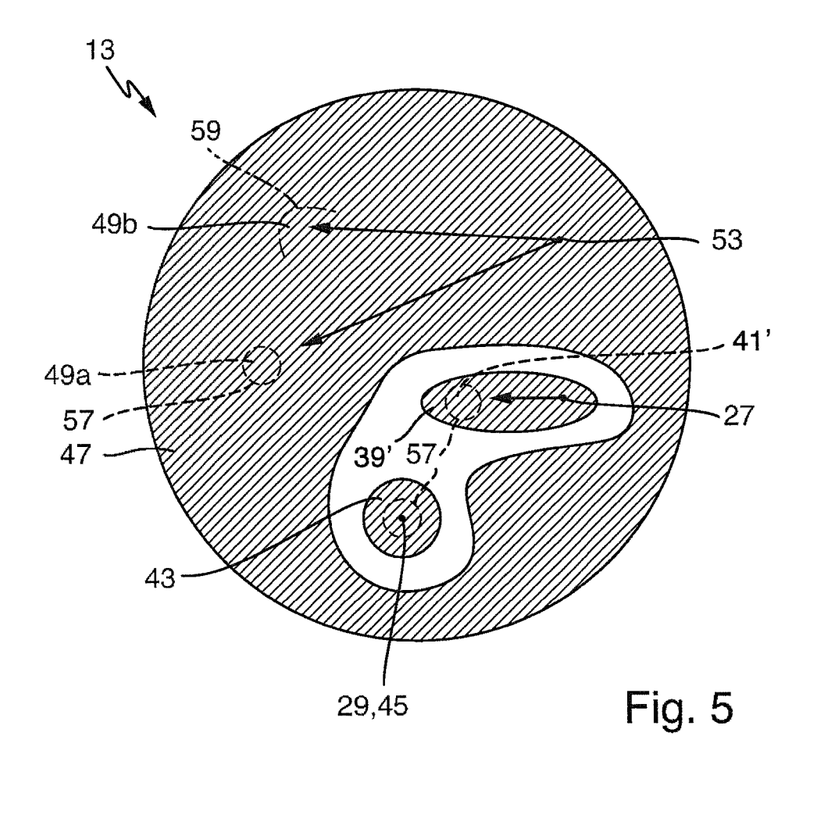
FIG. 5 shows: a plan view of the face of the base body of the pressure sensor from FIG. 4 which faces away from the membrane.

FIG. 5 shows a plan view of the front face of the base body 13 of the pressure sensor in FIG. 4 on the opposite side to the membrane. The connection area 53 to which the contact pin leads which is connected to the additional electrode 51 is schematically indicated there by a dot. The plan view furthermore shows an example of embodiment for the design of the coating 47 of the shield, the coating 39' covering the connection area 27 and the connection point 41' of the connection 31 connected to the measuring electrode 21, as well as the coating 43 covering the connection area 29 and the connection point 45 of the connection 33 connected to the reference electrode 23'. In this example of embodiment, the connection point 41' assigned to the connection 31 to the measuring electrode 21—as also shown in the example of embodiment in FIG. 3, and indicated by an arrow in FIG. 5—is positioned outside the corresponding connection area 27 and is electrically connected to it via the coating 39'. The connection point 45 assigned to the connection 33 to the reference electrode 23' is placed—as shown in the example of embodiment in FIG. 2—in the corresponding connection area 29 such that the coating 43 evenly covers connection area 29 and connection point 45.

Since the connection point 49, where the shield is ultimately contacted, may be located anywhere along the coating 47, there are two possible connection points, 49a, 49b, indicated in the drawing which are parallel and distanced from the connection area 53 of the shield and which may be used alternatively or parallel to each other for the contacting of the shield. The distance from the corresponding connection area 53 is indicated by arrows. A parallel use of two connection points makes sense, for example, when the shield is connected via the coating 47 to a reference potential, such as ground, that is simultaneously made available to an on-site electronic system as a reference potential via the coating 47.

According to the invention, at least one of the connections 31, 33 and/or the connection to the shield is connected to a connection element 55 via a soft-soldering connection created at the respective connection point 41 or 41', 45 or 45', 49, 49a, 49b. The connecting pins shown in FIG. 2 may, for example, be used as connecting elements 55. Alternatively, it is however also possible to use connecting wires or— preferably—contacts suitable for SMD soldering, esp. contacts to an on-site electronic system, and solder them to the corresponding connection points.

For this purpose, there is a groove 57, 59 provided in the base body 13 of the sensor for each of those connections 31, 33 to be contacted according to the invention. Said groove encompasses the connection point 41, 41', 45, 45', 49, 49a, 49b assigned to connection 31, 33 at least partly on the outside.

With regard to the shape of such grooves 57, 59, the details for groove 7 as given above will apply. Apart from the groove 59 which only partly encompasses the connection point 49b of the shield connection, all other grooves 57 shown in FIGS. 2, 3 and 5 take the form of a ring-shaped groove 57 completely surrounding the respective connection points 41, 41', 45, 45', 49, 49a.

Even in manufacture of the sensors according to the invention, the grooves 57, 59 are created in the way described at the beginning of this document. The coatings 39 or 39', 43 or 43', 47 are subsequently applied. In this process, as a minimum, coating is applied to those areas of the grooves 57, 59 which are located in areas where one of the connection areas 27, 29, 53 must be electrically connected to the corresponding physically separate connection point 41', 45', 49a via the corresponding coating 39', 43', 47. In the example of embodiment shown in FIG. 5, the coating 39' accordingly covers at least part of the area of the groove 57 surrounding the connection point 41' of the connection 31 to the measuring electrode 21 and the coating 47 covers at least partially the ring-shaped groove 57 surrounding the connection point 49a of the connection to the shield.

All other groove areas do not necessarily have to be coated, but may be if this is required, e.g. for reasons of production tolerances for the application of the respective coating or for other reasons inherent in, for example, the electrical characteristics of the respective coating. In the example of embodiment shown in FIG. 5, all grooves 57, 59 are completely coated.

The connection elements 55 are then soldered to the corresponding connection points 41 or 41', 45 or 45', 49, 49a, 49b by feeding or applying soft-solder material and then soldering as described above. FIG. 2 shows three soft-soldering connections 61 created by the method according to the invention, which are used to connect connection 31 to the measuring electrode 21, connection 33 to the reference electrode 23 and the shield connection to the corresponding connection element 55. Here too, the soft-soldering connections 61 are, for example, made of a tin-silver solder material, a tin-copper solder material or soldering material containing indium or bismuth, esp. a tin-silver solder material containing indium and/or bismuth. Alternatively, soldering material containing lead may be used here as well.

The connecting elements 55 are used here, esp. via a further soldering process, not only to make an electrical connection of the three connections 31, 33 with the corresponding contacts 63 of an on-site electronic system 65 but also to mechanically fasten the on-site electronic system 65 in a position at a distance from base body 13.

The invention claimed is:

1. A sensor having:
a base body with an outer insulating surface;
at least a first electrical connection which is routed into a connection area on said outer insulating surface of said base body;
an electrically conductive coating suitable for soft-soldering which is applied to the outer insulating surface of said base body, which includes said connection area of said electrical connection, and which includes a connection point provided for the contacting of said electrical connection;
a groove provided in said outer insulating surface of said base body which at least partly surrounds said connection point on the outside; and
a connecting element which is soldered onto the coating at said connection point via a soft-soldering connection; wherein:
the groove extends between the connection point and the connection area, and
said electrical conductive coating is applied at least to areas of said groove to provide said electrical connection between said connection area and said connection point by said conductive coating.

2. The sensor according to claim 1, wherein:
said electrical connection is a connection to a sensor shield against electromagnetic interference;
said coating is part of the shield; and
said coating forms the connection area of said electrical connection.

3. The sensor according to claim 1, further having:
at least one further electrical connection, which is routed into said connection area located on the outer insulating surface of said base body, wherein:
said connection area is coated with an electrically conductive coating suitable for soft-soldering applied to the exterior insulating surface of said base body, with said coating including said connection point provided for contacting of said electrical connection;
said connection point is at least partially surrounded on the outside by said groove provided in said base body;
at whose connection point said connecting element is soldered onto said coating via a soft-soldering connection;
wherein the electrically conductive coating of the further electrical connection is electrically insulated from the electrically conductive coating of the first electrical connection.

4. The sensor according to claim 1, wherein:
at least one groove encloses said respective connection point on all sides, esp. in a ring shape.

5. The sensor according to claim 1, wherein:
at least one groove shows a distinct bend or curve which allows for visual recognition of said connection point location.

6. The sensor according to claim 1, wherein:
the sensor is a capacitive pressure sensor with a measuring membrane connected to said base body thereby forming a measuring chamber;
electrical connection is a connection to a measuring electrode applied to said base body; and/or
connection is a connection to a reference electrode applied to said base body, and/or
said electrical connection is a connection passing through said base body to a counter-electrode affixed to a measuring membrane.

7. The sensor according to claim 6, wherein:
said coating of the connecting area, to which the connection connected to the counter-electrode is routed, also being said coating of said shield; and
the connection point provided for the contacting of the connection with the counter-electrode, being the same as the connection point intended for the contacting of the shield.

8. The sensor according to claim 1, wherein:
said base body consists of a ceramic material, esp. aluminum oxide ceramics; and/or
said coatings are of gold, silver, a copper alloy or metal layers, especially nickel or nickel alloys covered with a top layer suitable for soft-soldering, or consisting of a conductive metallic varnish, esp. a conductive carbon or silver lacquer; and/or
said soft-soldering connections are made of a tin-silver solder material, a tin-copper solder material or soldering material containing indium or bismuth, esp. a tin-silver solder material containing indium an/or bismuth.

* * * * *